United States Patent
Manning

[19]

[11] Patent Number: 5,930,615
[45] Date of Patent: Jul. 27, 1999

[54] METHOD OF FORMING CMOS HAVING SIMULTANEOUS FORMATION OF HALO REGIONS OF PMOS AND PART OF SOURCE/DRAIN OF NMOS

[75] Inventor: Monte Manning, Kuna, Id.

[73] Assignee: Micron Technology, Inc., Boise, Id.

[21] Appl. No.: 09/024,875

[22] Filed: Feb. 17, 1998

Related U.S. Application Data

[63] Continuation of application No. 08/562,806, Nov. 27, 1995, Pat. No. 5,736,440.

[51] Int. Cl.$^6$ .................................................. H01L 21/8238
[52] U.S. Cl. .......................... 438/232; 438/231; 438/527
[58] Field of Search .................................... 438/199, 231, 438/232, 527, FOR 168, FOR 216, FOR 217, FOR 218

[56] References Cited

U.S. PATENT DOCUMENTS

| | | | |
|---|---|---|---|
| 4,908,327 | 3/1990 | Chapman | 437/44 |
| 4,968,639 | 11/1990 | Bergonzoni | 437/57 |
| 5,036,019 | 7/1991 | Yamane et al. | 437/57 |
| 5,427,964 | 6/1995 | Kaneshiro et al. | 437/41 |
| 5,441,906 | 8/1995 | Burger | 437/41 |
| 5,500,379 | 3/1996 | Odake et al. | 437/34 |
| 5,532,176 | 7/1996 | Katada et al. | 437/34 |
| 5,736,440 | 4/1998 | Manning | 438/232 |

*Primary Examiner*—Peter Toby Brown
*Assistant Examiner*—Long Pham
*Attorney, Agent, or Firm*—Wells, St. John, Roberts, Gregory & Matkin, P.S.

[57] ABSTRACT

A semiconductor processing method of forming complementary NMOS and PMOS field effect transistors on a substrate comprises the following steps: (a) providing a first conductivity type region and a second conductivity type region of the semiconductor substrate, one of the first and second type regions being an n-type region and the other being a p-type region; (b) providing a first transistor gate over the first conductivity type region, the first transistor gate defining the gate of a second conductivity type field effect transistor; (c) providing a second transistor gate over the second conductivity type region, the second transistor gate defining the gate of a first conductivity type field effect transistor; (d) providing an implant masking layer over the first conductivity type region; and (e) ion implanting a second conductivity type dopant into the first conductivity type region through the implant masking layer to define graded junction regions for the second conductivity type field effect transistor and simultaneously ion implanting the second conductivity type dopant into the second conductivity type region to define halo implant regions for the first conductivity type field effect transistor. Field effect transistors produced in accordance with this invention are also disclosed.

19 Claims, 4 Drawing Sheets

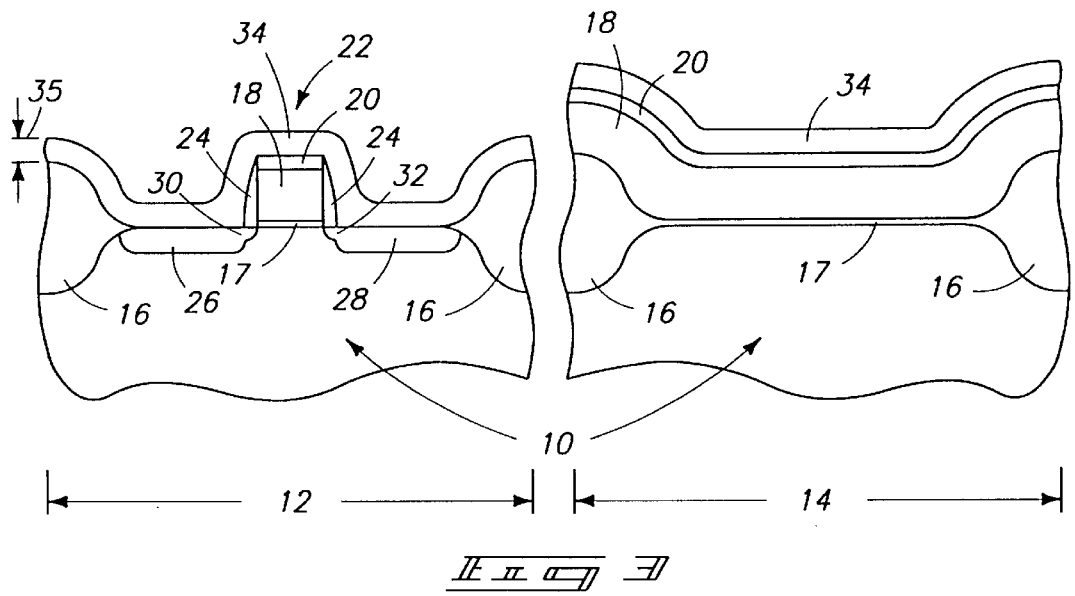
_Fig. 3_
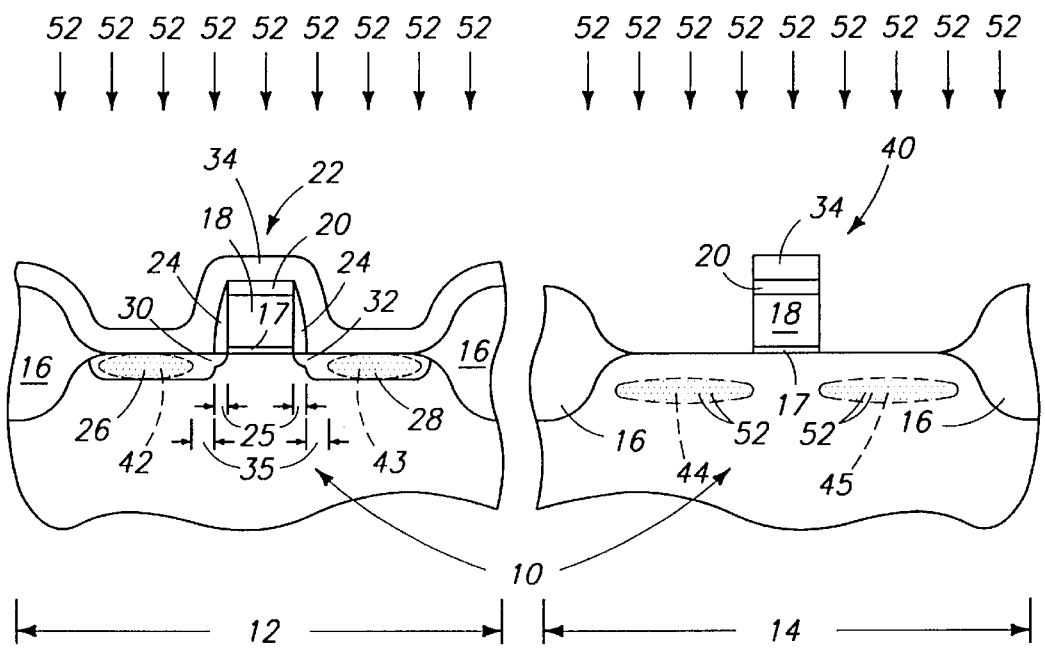
_Fig. 4_

5,930,615

METHOD OF FORMING CMOS HAVING SIMULTANEOUS FORMATION OF HALO REGIONS OF PMOS AND PART OF SOURCE/DRAIN OF NMOS

RELATED PATENT DATA

This patent resulted from a continuation application of U.S. patent application Ser. No. 08/562,806, now U.S. Pat. No. 5,736,440, filed Nov. 27, 1995.

PATENT RIGHTS STATEMENT

This invention was made with Government support under Contract No. MDA972-92-C-0054 awarded by Advanced Research Projects Agency (ARPA). The Government has certain rights in this invention.

TECHNICAL FIELD

This invention relates to a semiconductor processing method of forming complimentary NMOS and PMOS field effect transistors on a substrate.

BACKGROUND OF THE INVENTION

An MOS (metal-oxide-semiconductor) structure in semiconductor processing is created by superimposing several layers of conducting, insulating and transistor-forming materials. After a series of processing steps, a typical structure might comprise levels of diffusion, polysilicon and metal that are separated by insulating layers.

Complementary NMOS and PMOS field effect transistors are commonly called CMOS. There is a continual effort to decrease the size of CMOS devices so as to increase the speed of integrated circuitry formed from the devices. As the size of the NMOS and PMOS field effect transistors is decreased, undesired hot-carrier effects can become prevalent. Such hot-carrier effects can seriously degrade the performance characteristics of MOSFET (metal-oxide-semiconductor-field-effect-transistor) devices.

Since small circuitry is desired, several methods have been developed to avoid hot-carrier effects in MOSFET devices. Among these methods are the creation of graded junctions in NMOS or PMOS devices. Graded junctions are formed by creating a lightly doped buffer region between the heavily doped drain and the channel, outside of the channel. This produces a MOSFET device which has a graded or lightly doped extension. The graded junction reduces the maximum electric field near the drain by making the pn junction less abrupt. The reduction in the electric field reduces the hot-carrier effects in the MOSFET device.

A method for producing graded junctions in PMOS devices involves placing spacers adjacent a transistor gate and over a light dose of boron or $BF_2$ which has been previously implanted within the substrate operatively adjacent the gate. The method then involves implanting a heavy dose of boron or $BF_2$ within the substrate operatively adjacent the spacers and offset from the gate. A similar method can be used to produce graded junctions in NMOS devices if arsenic is used as a dopant in place of boron. An alternative method for producing graded junctions in NMOS devices involves adding phosphorus to arsenic-doped source and drain regions and driving the faster-diffusing phosphorus laterally ahead of the slower-diffusing arsenic with a temperature diffusion step.

A challenge in CMOS fabrication is to synchronize the fabrication of the paired NMOS and PMOS devices so that the desired construction of both types of devices results after all fabrication. When CMOS processes involve the formation of NMOS devices prior to formation of PMOS devices, the NMOS devices are generally subjected to high temperature processing while the PMOS devices are formed. This can lead to excess and undesired diffusion of n-type dopants in the NMOS devices. The problem is exaggerated when phosphorus is used to form graded junctions in the NMOS devices because phosphorus tends to diffuse quite rapidly.

Similarly, when CMOS processes involve the formation of PMOS devices prior to formation of NMOS devices, the PMOS devices are generally subjected to high temperature processing while the NMOS devices are formed. This can lead to excess and undesired diffusion of p-type dopants in the PMOS devices.

It is therefore desirable to develop CMOS processing methods which synchronize the steps of formation of the NMOS devices and PMOS devices such that graded junctions are formed in the NMOS or PMOS devices without over-diffusion of the graded junction dopant during subsequent processing steps.

BRIEF DESCRIPTION OF THE DRAWINGS

Preferred embodiments of the invention are described below with reference to the following accompanying drawings.

FIG. 3 is a view of the FIG. 1 wafer fragment shown at a processing step subsequent to that shown in FIG. 2.

FIG. 4 is a view of the FIG. 1 wafer fragment shown at a processing step subsequent to that shown in FIG. 3.

DETAILED DESCRIPTION OF THE PREFERRED EMBODIMENTS

Figure 1:
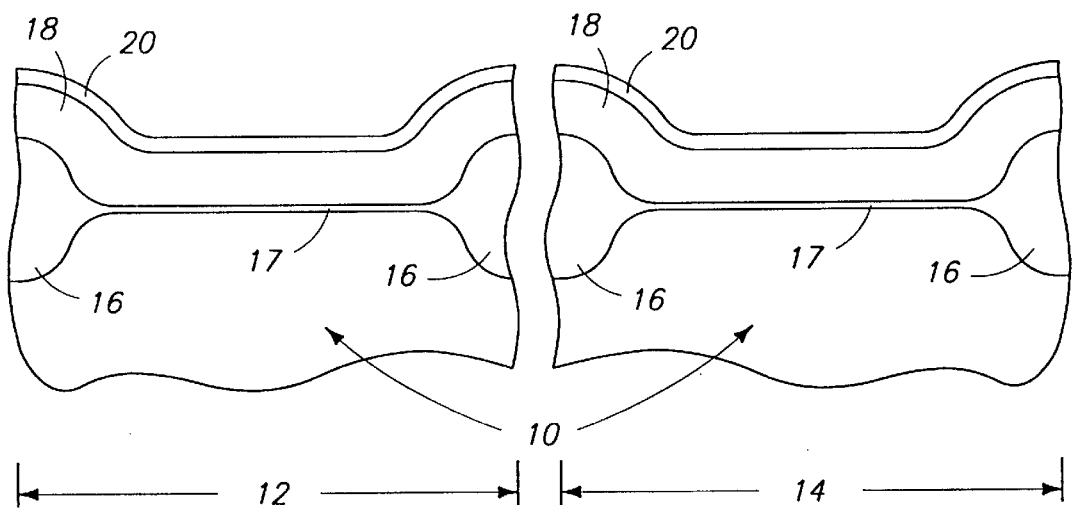
FIG. 1 is a diagrammatic fragmentary sectional view of a semiconductor wafer fragment at one processing step in accordance with one embodiment of the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming complementary NMOS and PMOS field effect transistors on a substrate, the method comprising the following steps:

providing a first conductivity type region and a second conductivity type region of the semiconductor substrate, one of the first and second type regions being an n-type region and the other being a p-type region;

providing a first transistor gate over the first conductivity type region, the first transistor gate defining the gate of a second conductivity type field effect transistor;

providing a second transistor gate over the second conductivity type region, the second transistor gate defining the gate of a first conductivity type field effect transistor;

providing an implant masking layer over the first conductivity type region; and ion implanting a second conductivity type dopant into the first conductivity type region through the implant masking layer to define graded junction regions for the second conductivity type field effect transistor and simultaneously ion implanting the second conductivity type dopant into the second conductivity type region to define halo implant regions for the first conductivity type field effect transistor.

More particularly, the present invention encompasses a method of forming complimentary NMOS and PMOS field effect transistors on a substrate. The invention includes the provision of a first conductivity type region and a second conductivity type region within a substrate, wherein one of the regions is a p-type region and the other is an n-type region. The invention further includes the provision of an implant masking layer over one of the two regions, followed by the implanting of either or both n-type and p-type dopants.

In one aspect of the invention, the implant masking layer is provided over the p-type region, and not over the complementary n-type region. In this aspect of the invention, the n-type dopant phosphorus is preferably implanted through the implant masking layer, into the p-type region, to form graded junction regions for an NMOS transistor. The phosphorus is preferably implanted with a blanket implant that extends across both the n-type and p-type regions. Thus, the phosphorus is preferably simultaneously implanted into the complementary n-type region to form a phosphorus halo for a PMOS transistor as the phosphorus is implanted into the n-type region. Also, while the implant masking layer is over the p-type region, a p-type dopant, such as boron, will preferably be implanted into the n-type region to form source and drain regions for the PMOS transistor. The p-type dopant will preferably be implanted at an energy such that the implant masking layer functions as a mask to prevent p-type dopant implanting into NMOS source and drain regions associated with the NMOS transistor.

In another aspect of the invention, the implant masking layer is over the n-type region, and not over the complementary p-type region. In this aspect of the invention, the p-type dopant boron is preferably implanted through the implant masking layer, and into the n-type region, to form graded junction regions for a PMOS transistor. The boron is preferably implanted with a blanket implant that extends across both the n-type and p-type regions. Thus, the boron is preferably simultaneously implanted into the p-type region to form a boron halo for an NMOS transistor as the boron is implanted into the n-type region. Also, while the implant masking layer is over the n-type region, an n-type dopant, such as arsenic, will preferably be implanted into the p-type region to form source and drain regions for the NMOS transistor. The n-type dopant will preferably be implanted at an energy such that the implant masking layer functions as a mask to prevent n-type dopant implanting into PMOS source and drain regions associated with the PMOS transistor.

With reference to FIGS. 1–7, an embodiment of the method of the present invention is illustrated. While the shown embodiment has the implant masking layer blocking the p-type, or NMOS region, it is to be understood that the n-type regions and p-type regions shown in FIGS. 1–7 can be reversed so that the implant masking layer blocks the n-type, or PMOS region.

The shown embodiment is a method of forming complimentary NMOS and PMOS field effect transistors on a substrate, and of forming graded junction regions between an active diffusion area of the NMOS transistor and the substrate. With reference to FIG. 1, the shown embodiment comprises provision of a semiconductor substrate 10 with a p-type doped region 12 and an n-type doped region 14 thereon. Since p-type doped region 12 will be the site of an n-channel transistor, and since n-type doped region 14 will be the site of a p-channel transistor, these regions are also referred to herein as NMOS region 12 and PMOS region 14.

In the shown embodiment, field oxide regions 16 and a gate oxide layer 17 are provided over regions 12 and 14, and covered by a gate layer 18 and a metal layer 20. Preferably, gate layer 18 comprises polysilicon and metal layer 20 comprises tungsten silicide. In an alternate embodiment of the invention, an oxide cap (not shown) may be provided over layers 18 and 20. In yet another embodiment of the invention, metal layer 20 may not be provided over one or both of the regions 12 and 14.

Figure 2:
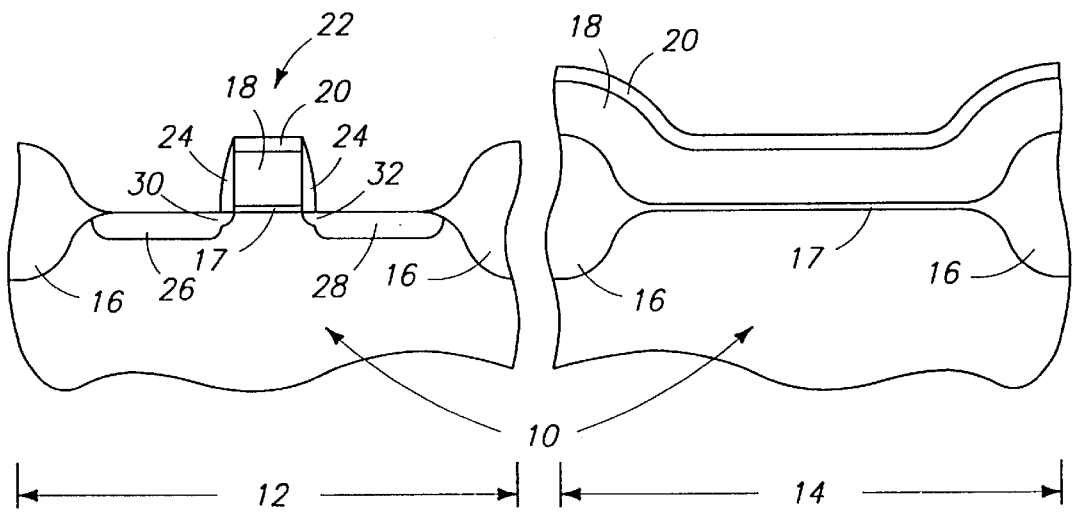
FIG. 2 is a view of the FIG. 1 wafer fragment shown at a processing step subsequent to that shown in FIG. 1.

Referring to FIG. 2, layers 18 and 20 are patterned to provide NMOS gate 22 over NMOS region 12, while leaving gate layer 18 and metal layer 20 not patterned for gate formation over PMOS region 14. If, as discussed above, an oxide cap is provided over layers 18 and 20, this cap will preferably be patterned together with layers 18 and 20. As shown in FIG. 2, insulative spacers 24 are provided relative to NMOS gate 22. An NMOS source region 26 and an NMOS drain region 28 are provided within substrate 10 operatively adjacent to NMOS gate 22. The preferred n-type dopant material for regions 26 and 28 is arsenic which minimizes the vertical and lateral diffusion of regions 26 and 28 during any subsequent thermal treatments. Preferably, spacers 24 are provided before the NMOS source region 26 and NMOS drain region 28 are doped with n-type material. Lightly doped regions 30 and 32 are formed prior to spacer formation. The spacers then block the subsequent implant that forms NMOS source and drain regions 26 and 28. Insulative spacers 24 preferably comprise silicon dioxide or silicon nitride or some combination thereof.

FIG. 3 shows the provision of an implant masking layer 34 over NMOS region 12 and PMOS region 14 of semiconductor substrate 10. Implant masking layer 34 is over NMOS gate 22, NMOS source region 26 and NMOS drain region 28 in NMOS region 12, and over layers 18 and 20 in PMOS region 14. Implant masking layer 34 preferably comprises a layer of silicon dioxide deposited to a thickness 35 of from about 500 Angstroms to about 2000 Angstroms, with 750 Angstroms being most preferred.

Referring to FIG. 4, layers 18, 20 and 34 are patterned, preferably during the same lithographic and etch sequence. In the shown embodiment, the patterning of layers 18, 20 and 34 provides PMOS gate 40 over PMOS region 14 of semiconductor substrate 10 and provides an isolated segment of implant masking layer 34 overlying PMOS gate 40. Preferably, NMOS source region 26 and NMOS drain region 28 are provided within semiconductor substrate 10 before PMOS gate 40 is formed.

After providing NMOS source and drain regions 26 and 28, and after providing PMOS gate 40, phosphorus 52 is implanted into PMOS region 14 and NMOS region 12. Preferably the phosphorous is implanted at a density of about $2.5 \times 10^{12}$ and an energy of about 80 KeV. The phosphorus implanted into PMOS region 14 defines phosphorous halo implant regions 44 and 45, while the phosphorus implanted into NMOS region 12 defines NMOS graded junction regions 42 and 43.

Figure 6:
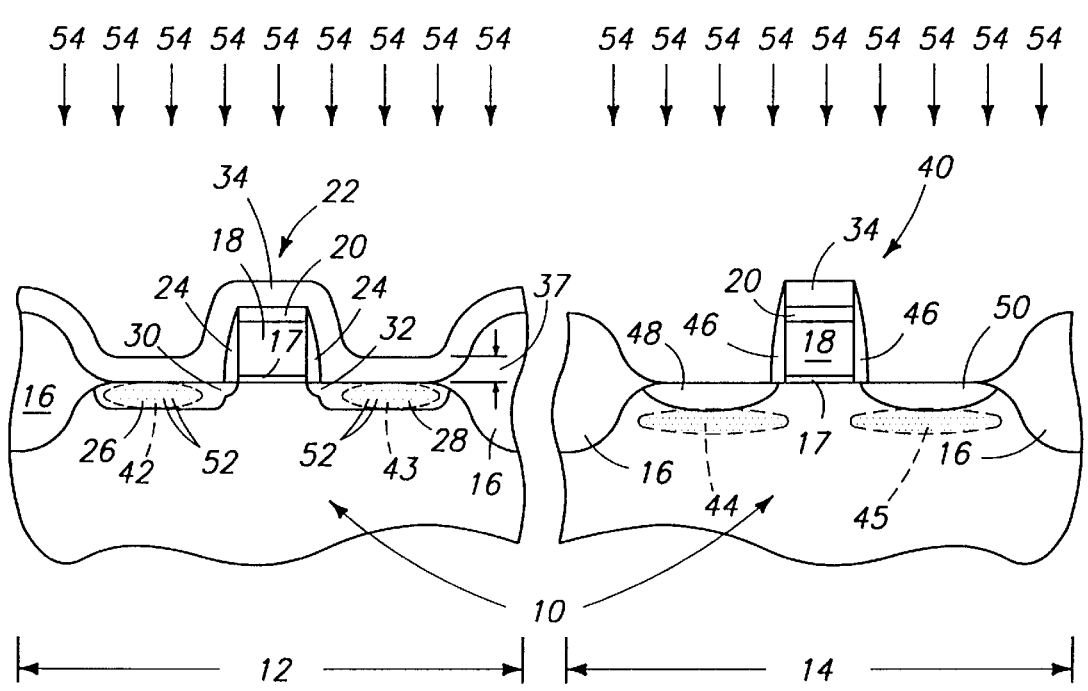
FIG. 6 is a view of the FIG. 1 wafer fragment shown at a processing step subsequent to that shown in FIG. 5.
Figure 7:
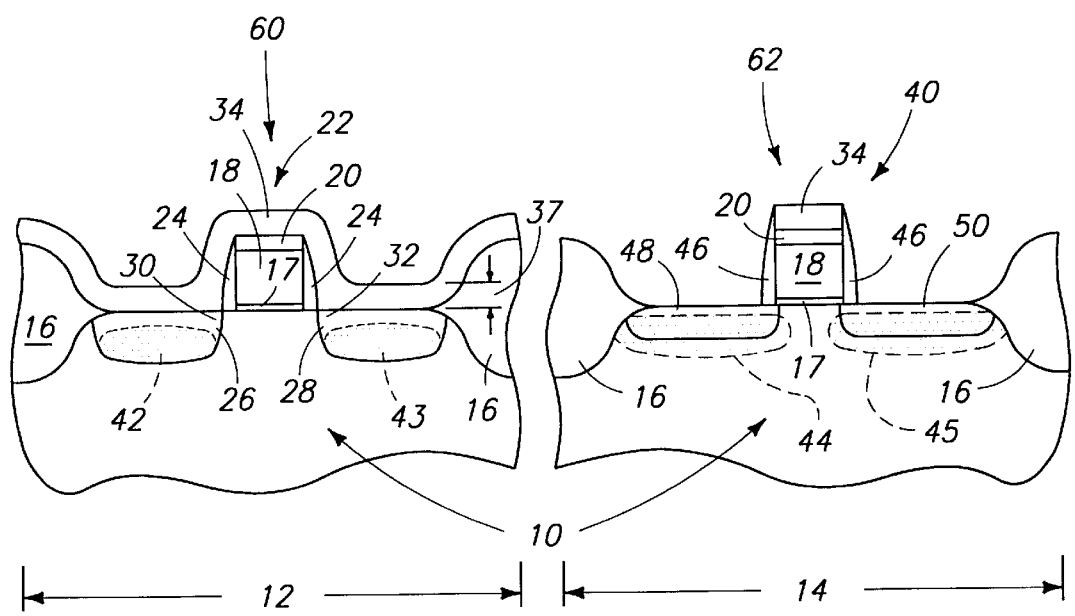
FIG. 7 is a view of the FIG. 1 wafer fragment shown at a processing step subsequent to that shown in FIG. 6.

As shown in FIG. 4, implant masking layer 34 is preferably not over the regions defined to become PMOS source region 48 and drain region 50 (the PMOS source and drain regions 48 and 50 are shown in FIGS. 6 and 7) as phosphorous 52 is implanted, and is over the entire NMOS region 12 as phosphorus 52 is implanted. Accordingly, phosphorus implanted into NMOS region 12 is implanted shallower than the phosphorus implanted in PMOS region 14.

As shown in FIGS. 2–4, insulative spacers 24 are preferably provided adjacent to NMOS gate 22 before providing the implant masking layer and before implanting phosphorus. FIG. 4 shows that the insulative spacers 24 have a spacer width 25 and that implant masking layer 34 is provided to a desired thickness 35. The combined spacer width and desired implant masking layer thickness determines the distance that the implanted phosphorus regions 42 and 43 will be spaced from NMOS gate 22. Thus, when phosphorous 52 is implanted into NMOS region 12, graded junction regions 42 and 43 are spaced from NMOS gate 22 by about a sum of spacer width 25 and implant masking layer thickness 35. Preferably, spacer width 25 will be from about 500 Angstroms to about 2000 Angstroms with about 1100 Angstroms being most preferred. Preferably, masking layer thickness 35 will be from about 500 Angstroms to about 2,000 Angstroms, as previously described, with about 750 Angstroms being most preferred.

Figure 5:
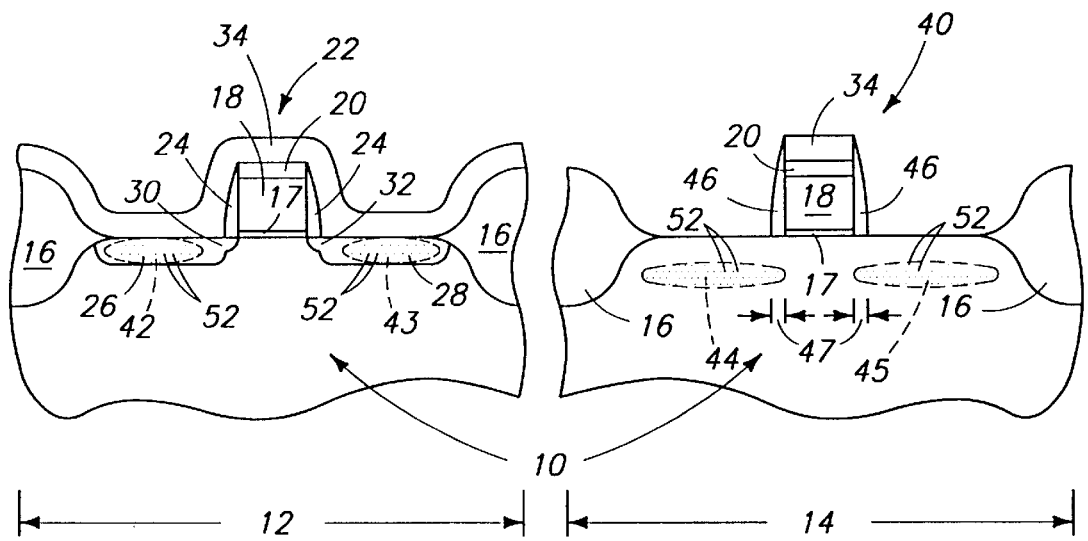
FIG. 5 is a view of the FIG. 1 wafer fragment shown at a processing step subsequent to that shown in FIG. 4.

Referring to FIG. 5, insulative spacers 46 are provided adjacent PMOS gate 40 after the phosphorus implant. Insulative spacers 46 are preferably applied by deposition of an insulating dielectric layer followed by an anisotropic etch as is will known by persons skill in the art. Insulative spacers 46 preferably comprise silicon dioxide or silicon nitride and preferably have a width of from about 500 Angstroms to about 2000 Angstroms, with about 800 Angstroms being most preferred. The etch to produce spacers 46 may overetch into the exposed silicon dioxide layer 34 by about 200 Angstroms constituting a 25% overetch.

Referring to FIG. 6, p-type material 54 is ion implanted into PMOS region 14 operatively adjacent PMOS gate 40 to produce source and drain diffusion regions 48 and 50, respectively. P-type material 54 is implanted at a selected energy level after providing the phosphorous implants, and with implant masking layer 34 over NMOS region 12. The selected implant energy level is chosen to be sufficiently low to effectively use the remaining thickness of implant masking layer 34 as a mask to p-type implanting into the NMOS source and drain regions 26 and 28, and also is chosen so that p-type material 54 is implanted shallower than phosphorus halo 44 and 45.

As discussed above, implant masking layer 34 is preferably silicon dioxide with a thickness from about 500 Angstroms to about 2000 Angstroms. The implant masking layer 34 is reduced in thickness by the p-channel spacer overetch. The final masking layer thickness immediately prior to the p-channel source and drain implant is preferably between about 450 Angstroms and about 1700 Angstroms with 550 Angstroms being most preferred. The final thickness needs to be sufficient to completely protect the n-channel source and drain regions from being implanted with p-type material 54. Under such preferable conditions, p-type material 54 is preferably implanted at an energy of from about 5 KeV to about 150 KeV.

Most preferably, p-type material 54 is $BF_2$ and is implanted at an energy of from about 25 KeV to about 30 KeV. The range of $BF_2$ penetration into $SiO_2$ at 25 KeV is determined to be about 160 Angstroms with a standard deviation of about 60 Angstroms. Thus, if implant masking layer 34 comprises $SiO_2$, and if the final thickness 35 of the implant masking layer over NMOS region 12 is greater than 500 Angstroms after the p-channel spacer etch, this will be sufficient to block $BF_2$ at 25 KeV from reaching NMOS source and drain regions 26 and 28. Most preferably, implant masking layer 34 has a final thickness 35 of 550 Angstroms and the p-type implant material is $BF_2$ implanted at a density of about $3.0 \times 10^{15}$ and an energy of about 25 KeV.

Referring to FIG. 7, substrate 10 is subjected to thermal conditions effective to provide graded junction regions 42 and 43 deeper within substrate 10 than NMOS source and drain regions 26 and 28, thereby forming NMOS field effect transistor 60. The thermal conditions also diffuse phosphorous halo implant regions 44 and 45, thereby forming PMOS field effect transistor 62. Preferably the thermal processing after the implant of p-type material is from about 700° C. to about 1100° C. and from about 20 seconds to about 2 hours, with about 900° C. for about 30 minutes being most preferred.

Grading the NMOS source and drain junctions with phosphorus in this way reduces the junction capacitance of the device and therefore increases the circuit's speed. The phosphorus does not appreciably diffuse laterally under gate 60, beyond the LDD regions 30 and 32 which were formed prior to spacers 24. Thus, by offsetting the phosphorus implant from the channel region with the spacers 24 and thickness 35 of layer 34, and by adding the phosphorus later in the process, the effective channel length is not affected. Also, the junction depth of the NMOS source and drain regions is increased, thereby reducing the possibility of contact etch penetration of the source and drains that would cause high junction leakage and possible device failure. The increased junction depth occurs away from the channel region, as described above, and therefore does not impart short channel effects. For the PMOS devices, the phosphorus halo performs its usual function of preventing source-to-drain punch through and allowing shorter PMOS channel lengths.

As discussed previously, the method of the present invention also encompasses embodiments in which the implant masking layer 34 is over the PMOS region 14 instead of being over the NMOS region 12. In such embodiments, PMOS source and drain regions, preferably comprising a boron-containing dopant material, would be provided in the FIG. 2 step instead of NMOS source and drain regions 26 and 28. Also, boron would preferably be implanted in the FIG. 4 step instead of phosphorus 52 to define boron halo implant regions in the NMOS region and to define PMOS graded junction regions in the PMOS region. Most preferably, the boron would be implanted at a density of about $5 \times 10^{12}$ and an energy of about 30 KeV.

Additionally, n-type material would be implanted in the FIG. 6 step instead of the p-type material 54 to produce source and drain diffusion regions within the substrate operatively adjacent NMOS gate 22. Preferably, the n-type material would be arsenic and, under the preferred conditions of final masking layer thickness discussed above, would be implanted at an energy of about 30 KeV. Further, the thermal conditions described with reference to FIG. 7 would be effective to provide graded junction regions deeper than PMOS source and drain regions to thereby form a PMOS field effect transistor. The thermal conditions would preferably also diffuse boron halo implant regions to thereby form an NMOS field effect transistor.

The method of this invention can be used to form memory-type circuits as well as logic-type circuits. When the method is used to form memory-type circuits, there will likely be other steps between the implantation of the NMOS source and drains and the implantation of the PMOS source and drains in addition to the steps illustrated herein. For instance, in the formation of SRAM (static random access memory) cells there may be the additional formation of thin film transistors and Vss lines in an array of NMOS and PMOS devices. In DRAM (dynamic random access memory) cells, the addition of stacked capacitors also involves layered conductors and insulators. If oxides are used to isolate the layers of the array from one-another, then one or more of these oxides can be used to form the implant masking layer of this invention. If such oxides are used to form the implant masking layer, then making the oxide thinner to allow the PMOS or NMOS halo through will provide an additional benefit of increasing the internal cell capacitance. Higher cell capacitance generally improves soft error rate (SER) immunity in both SRAM's and DRAM's.

The method of this invention may be accomplished with a number of different implant energies, implant masking layer compositions and thicknesses, and spacer compositions and dimensions. In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method comprising:
   providing a semiconductor substrate and defining first source/drain region locations and second source/drain region locations within the substrate;
   providing a first conductivity-type dopant in the first source/drain region locations to form first source/drain regions in the first source/drain region locations;
   providing a second conductivity-type dopant in the second source/drain region locations to form second source/drain regions in the second source/drain region locations, one of the first and second conductivity types being p-type and the other of the first and second conductivity types being n-type;
   covering either the first source/drain region locations or is the second source/drain region locations with a masking layer, while leaving the other of the first source/drain region locations and the second source/drain region locations uncovered; and
   with the masking layer in place, implanting a dopant into the covered region locations and uncovered region locations to form graded junction regions in the covered region locations and halo regions in the uncovered region locations.

2. A semiconductor processing method comprising:
   providing a semiconductor substrate, the substrate having a p-type region and an n-type region;
   defining NMOS source/drain region locations in the p-type region and PMOS source/drain region locations in the n-type region;
   providing n-type dopant in the NMOS source/drain region locations to form NMOS source/drain regions in the NMOS source/drain region locations;
   providing p-type dopant in the PMOS source/drain region locations to form PMOS source/drain regions in the PMOS source/drain region locations;
   covering either the NMOS source/drain region locations or the PMOS source/drain region locations with a masking layer, while leaving the other of the NMOS source/drain region locations and the PMOS source/drain region locations uncovered; and
   with the masking layer in place, implanting a dopant into the covered region locations and uncovered region locations to form graded junction regions in the covered region locations and halo regions in the uncovered region locations.

3. The method of claim 1 wherein the covered region locations are the NMOS source/drain region locations.

4. The method of claim 1 wherein the covered region locations are the PMOS source/drain region locations.

5. A semiconductor processing method comprising:
   providing a semiconductor substrate, the substrate having a p-type region and an n-type region;
   providing a pair of transistors formed proximate the p-type region and n-type region, respectively; the transistor formed proximate the p-type region being an NMOS transistor and comprising n-type doped source/drain regions; the transistor formed proximate the n-type region being an PMOS transistor and comprising p-type doped source/drain regions;
   covering an entirety of one of the p-type and n-type regions with a masking layer, while leaving at least a portion of the other of the p-type and n-type regions uncovered; and
   with the masking layer in place, implanting a dopant into the entirely covered region and uncovered portion; the implanted dopant being utilized as graded junction regions for the transistor proximate the entirely covered region, and being utilized as halo regions for the transistor proximate the uncovered portion.

6. The method of claim 5 wherein the entirely covered region is the n-type region.

7. The method of claim 5 wherein the entirely covered region is the p-type region.

8. A semiconductor processing method comprising:
   defining an NMOS region location and a PMOS region location of a semiconductor substrate;
   defining NMOS source/drain region locations within the NMOS region location and PMOS source/drain region locations within the PMOS region location;
   forming a transistor gate over the NMOS region location;
   providing an n-type dopant within the NMOS source/drain region locations to form NMOS source/drain regions;
   forming a transistor gate over the PMOS region location;
   providing a p-type dopant within the PMOS source/drain region locations to form PMOS source/drain regions;
   forming an implant masking layer over either the NMOS source/drain region locations or the PMOS source/drain region locations and not over the other of the NMOS source/drain region locations and the PMOS source/drain region locations; and
   implanting a common dopant into the covered source/drain region locations and uncovered source/drain region locations to form graded junction regions in the covered region locations and halo implant regions in the uncovered region locations.

9. The method of claim 8 wherein the forming of either the PMOS source/drain regions or the NMOS source/drain regions comprises:
   after forming the implant masking layer, implanting either the n-type dopant or the p-type dopant into the uncovered source/drain region locations to form either the PMOS source/drain regions or the NMOS source/drain regions; the implant masking layer preventing the implanted dopant from entering the covered source/drain region locations.

10. The method of claim 8 wherein the implant masking layer is over at least one of the NMOS gate and the PMOS gate.

11. The method of claim 8 wherein the covered region locations are the NMOS source/drain region locations and the common dopant is phosphorus.

12. The method of claim 8 wherein the covered region locations are the PMOS source/drain region locations and the common dopant is boron.

13. The method of claim 8 wherein the forming the transistor gates comprises:

forming a gate layer over the NMOS and PMOS region locations; and patterning the gate layer over one of the NMOS and PMOS region locations to form one of the transistor gates while leaving the gate layer not patterned for gate formation over the other of the NMOS and PMOS region locations.

14. The method of claim 8 wherein the step of forming an implant masking layer comprises forming a layer of silicon dioxide to a thickness of from about 500 Angstroms to about 2000 Angstroms.

15. A semiconductor processing method comprising:

defining an NMOS region location and a PMOS region location of a semiconductor substrate;

forming a gate layer over the NMOS and PMOS region locations;

patterning the gate layer over one of the NMOS and PMOS region locations to form a first transistor gate while leaving the gate layer not patterned for gate formation over the other of the NMOS and PMOS region locations;

forming first source/drain regions within the substrate operatively adjacent the first transistor gate;

forming insulative spacers adjacent to the first transistor gate, the insulative spacers having a spacer width;

forming an implant masking layer over the first transistor gate, the first source/drain regions, the insulative spacers adjacent the first transistor gate, and the unpatterned gate layer over the other of the NMOS and PMOS region locations;

patterning the unpatterned gate layer and the implant masking layer during the same lithographic and etch sequence to form a second transistor gate over the other of the NMOS and PMOS region locations, and to form an isolated segment of the implant masking layer overlying the second transistor gate;

implanting a first dopant into the first source/drain regions through the implant masking layer and into the other of the NMOS and PMOS region locations to form first implant regions adjacent the second transistor gate and to form second implant regions adjacent the first transistor gate, the second implant regions as implanted being spaced from the first transistor gate by about a sum of the spacer width and the implant masking layer thickness; and subsequent to patterning the gate layer and implant masking layer over the other of the NMOS and PMOS region locations, implanting a second dopant into said other region location to form second source/drain regions adjacent the second transistor gate; the implant masking layer preventing the second dopant from entering the first source/drain regions.

16. The method of claim 15 wherein the first source/drain regions are NMOS source/drain regions and the first dopant is phosphorus.

17. The method of claim 15 wherein the first source/drain regions are PMOS source/drain regions and the first dopant is boron.

18. The method of claim 15 further comprising subjecting the substrate to thermal conditions subsequent to implanting the first dopant, the thermal conditions being effective to provide the second implant regions deeper within the substrate than the first source/drain regions.

19. A semiconductor processing method of forming complementary NMOS and PMOS field effect transistors on a substrate, and of forming graded junction regions between the active diffusion area of the NMOS transistor and the substrate, the method comprising the following steps:

defining an NMOS region location and a PMOS region location of a semiconductor substrate;

providing a gate layer over the NMOS and PMOS region locations, the gate layer comprising polysilicon;

patterning the gate layer over the NMOS region location to form an NMOS gate while leaving the gate layer not patterned for gate formation of a PMOS field effect transistor over the PMOS region location;

providing NMOS source and drain regions within the substrate operatively adjacent the NMOS gate;

providing insulative spacers adjacent to the NMOS gate, the insulative spacers having a spacer width;

providing an implant masking layer to a desired thickness over the NMOS gate, the NMOS source region, the NMOS drain region, the gate layer over the PMOS region location of the semiconductor substrate, and the insulative spacers adjacent the NMOS gate;

patterning the gate layer and the implant masking layer over the PMOS region location during the same lithographic and etch sequence to form a PMOS gate over the PMOS region location of the semiconductor substrate and to form an isolated segment of the implant masking layer which overlies the PMOS gate;

blanket ion implanting phosphorus into the NMOS region location through the implant masking layer and into the PMOS region location to form phosphorus halo implant regions for the PMOS field effect transistor and to form graded junction regions for the NMOS field effect transistor, the graded junction regions as implanted being spaced from the NMOS gate by about a sum of the spacer width and the implant masking layer thickness; and subsequent to patterning the gate layer and implant masking layer over the PMOS region location, ion implanting p-type material into the PMOS region location of the substrate operatively adjacent the PMOS gate at a selected implant energy level to form source and drain regions for the PMOS transistor; the selected implant energy level being sufficiently low to effectively use the implant masking layer as a mask to p-type implanting into the NMOS source and drain regions.

* * * * *

UNITED STATES PATENT AND TRADEMARK OFFICE
CERTIFICATE OF CORRECTION

PATENT NO.    : 5,930,615
DATED         : July 27, 1999
INVENTOR(S)   : Monte Manning It is certified that error appears in the above-identified patent and that said Letters Patent is hereby corrected as shown below:

Col. 7, l. 43:    Delete "is"

Col. 8, l. 9:     Replace "1" with --2--

Col. 8, l. 11:    Replace "1" with --2--

Signed and Sealed this

Fourteenth Day of March, 2000

Attest:

Q. TODD DICKINSON

Attesting Officer    Commissioner of Patents and Trademarks